(12) United States Patent
Takaishi et al.

(10) Patent No.: US 6,798,018 B2
(45) Date of Patent: Sep. 28, 2004

(54) SEMICONDUCTOR DEVICE HAVING MOSFET OF TRENCH STRUCTURE AND METHOD FOR FABRICATING THE SAME

(75) Inventors: Masaru Takaishi, Kyoto (JP); Koichi Kitaguro, Kyoto (JP); Hiroki Takada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/167,490

(22) Filed: Jun. 13, 2002

(65) Prior Publication Data

US 2002/0190313 A1 Dec. 19, 2002

(30) Foreign Application Priority Data

Jun. 14, 2001 (JP) ........................................ 2001-180316

(51) Int. Cl.[7] .............................................. H01L 29/76
(52) U.S. Cl. ...................... 257/334; 257/328; 257/329; 257/330; 257/331; 257/332; 257/621
(58) Field of Search ................................ 257/328–334, 257/621

(56) References Cited

U.S. PATENT DOCUMENTS 5,705,830 A * 1/1998 Siergiej et al. ................ 257/77
6,211,549 B1 * 4/2001 Funaki et al. ................ 257/329
6,323,518 B1 * 11/2001 Sakamoto et al. .......... 257/330
6,580,121 B2 * 6/2003 Hisamoto ..................... 257/328

FOREIGN PATENT DOCUMENTS

JP    63228759 A  *  9/1988    ........... H01L/29/78
JP    10135490 A  *  5/1998    ......... H01L/29/861

* cited by examiner

Primary Examiner—Tom Thomas
Assistant Examiner—Eugene Lee
(74) Attorney, Agent, or Firm—Rabin & Berdo, P.C.

(57) ABSTRACT

A semiconductor device has a cell region where transistor cells of a trench structure are arranged in a matrix form, in which a recessed trench is formed in a semiconductor layer, a gate oxide film is formed inside the recessed trench, and a gate electrode formed of polysilicon is disposed inside the recessed trench. To have contact with a gate wiring formed of a metal film, a gate pad disposed continuously to the gate electrode is placed inside a recessed part formed in the same depth as the recessed trench. Consequently, many transistor cells of the trench structure are formed in a matrix form. Even in a semiconductor device where the gate wiring formed of a metal film is contacted with the gate electrode, a semiconductor device of a structure allowing gate voltage to be increased sufficiently can be obtained.

8 Claims, 5 Drawing Sheets

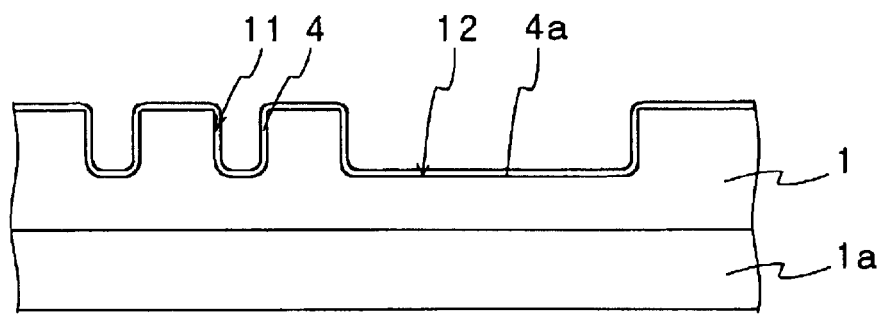
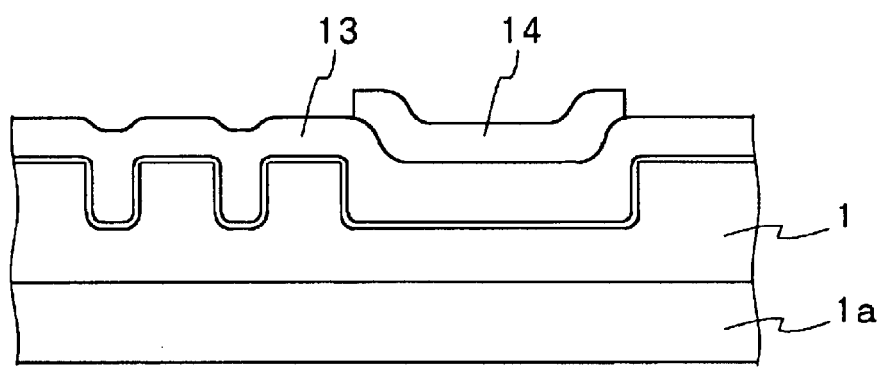
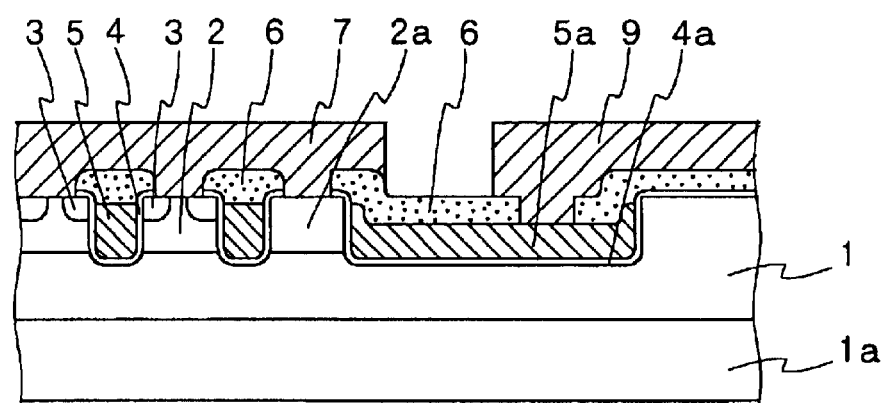

SEMICONDUCTOR DEVICE HAVING MOSFET OF TRENCH STRUCTURE AND METHOD FOR FABRICATING THE SAME

BACKGROUND OF THE INVENTION

The present invention relates to a semiconductor device having an insulated gate power MOSFET in which a gate electrode is formed in a recessed trench formed from the surface of a semiconductor layer, so-called transistor cells of a trench structure are arranged in a matrix form. More specifically, the invention relates to a semiconductor device having a MOSFET improved in gate dielectric breakdown voltage by forming a gate pad contacted with a gate wiring inside a recessed part etched from the semiconductor layer surface as similar to the recessed trench formed with the gate electrode.

A high-power gate-driven MOS transistor of a traditional trench structure adopts a structure where many transistor cells are arranged in a matrix form for the realization of heavy current. For example, as shown in FIG. 8A of a partially sectional illustration, an n-type semiconductor layer (epitaxial growth layer) 21 to be a drain region is epitaxially grown over an $n^+$-type semiconductor substrate 21a. A recessed trench is formed in the semiconductor layer 21 in a grid form. A gate oxide 24 is deposited over the inner surface, and polysilicon to be a gate electrode 25 is buried. Then, a p-type channel diffusion region 22 is formed in the semiconductor layer 21 therearound, and an $n^+$-type source region 23 is formed around on the gate electrode 25 side, whereby a channel region 22a is formed vertically as having contact with the gate oxide 24. Furthermore, a contact hole is formed in an insulating film 26 comprised of $SiO_2$; the insulating film is formed over the surface. A source wiring 27 is formed so as to have Ohmic contact with the exposed source region 23 and channel diffusion region 22. A drain electrode 28 is formed on the backside of the semiconductor substrate 21a.

The gate electrode 25 described above is comprised of polysilicon and is not formed into fully low resistance. Therefore, as depicted in FIG. 8B of a plan illustration showing an example of a gate wiring 29 of a semiconductor chip, it is formed in which the gate wiring of a metal film comprised of Al is partially connected around a transistor cell region 30 or inside the cell region 30 so as not to increase resistance in cells remote from a wire bonding part 29a. To contact the polysilicon film with the metal film formed of Al, as shown in FIG. 8C of a partially sectional illustration showing the portion of the gate wiring 29, a gate pad 25a is formed on the semiconductor layer surface continuously to the gate electrode 25 through a gate oxide (not shown). The gate wiring 29 is formed above the gate pad 25a through an insulating film 31 (the insulating film is also formed on the left side in the drawing, but it is omitted in the drawing). In addition, as shown in FIG. 8B, there is also the case where the gate wiring called a gate finger 29b is disposed in the cell region 30 in places, but the case has the same structure as well. In FIG. 8B. 27a denotes a wire bonding portion of the source wiring.

Furthermore, a plan structure of a cell surrounded by the gate electrodes in the transistor cells is formed into an arbitrary shape such as a square, pentagon or hexagon. Moreover, in these transistors, they are often connected to an inductive load such as a motor. In this case, a reverse electromotive force might be applied when the operation is turned off. To prevent the transistors from being destroyed, such a method is adopted that the source electrode 27 is also connected to the channel diffusion region 22 as described above, whereby a reverse protection diode is formed between the source and the drain.

As set forth, in the MOSFET of the trench structure, the gate pad 25a connected to the gate wiring 29 is formed over the semiconductor layer surface through the gate oxide. Thus, it is positioned higher than the gate electrode 25 formed inside the recessed trench, and the gate pad 25a formed continuously to the gate electrode 25 is passed through a corner part of the recessed trench as indicated by A shown in FIG. 8C. Usually it is difficult to form an oxide film in a corner part and a resultant film becomes thinner in general, and thus problems arise such that the gate pad is short-circuited with the semiconductor layer, or gate voltage is dropped. On this account, the corner part undergoes a process called a rounding process, that is, a process for rounding the corner part in order to sufficiently deposit the gate oxide over the corner part as well. Even so, voltage cannot be enhanced enough. As for the process for rounding the corner part, a process in which sacrifice oxidation is performed to remove the oxide film in order to remove the semiconductor layer roughened after etching such as reactive ion etching; sacrifice oxidation is performed at a high temperature of about 1100° C. (generally, about 900° C.) to form a thick oxide film and remove it.

Additionally, in this type of semiconductor device, it is also necessary to sufficiently be protected from surges particularly.

Furthermore, it has been desired that signals can be transmitted to the surrounding transistor cells in low resistance without disposing the gate fingers, many cells can be formed as many as possible, and ON resistance can be reduced to realize heavy current.

Moreover, in the semiconductor device having many transistor cells of this type arranged in a matrix form, a problem arises that electric fields tend to concentrate on transistor cells around outside the cell region for easy destruction.

SUMMARY OF THE INVENTION

The present invention has been made to solve these problems. The purpose of the present invention is to provide a semiconductor device having a structure capable of sufficiently increasing gate voltage even in such a semiconductor device in which many transistor cells of a trench structure are formed in a matrix form and the gate electrodes thereof are contacted with a gate wiring formed of a metal film.

Another purpose of the present invention is to provide a semiconductor device having a structure that enhances voltage by a trench structure and is hardly broken down in case of a surge.

Still another purpose of the present invention is to provide a semiconductor device having a structure that reduces gate wirings as few as possible and allows signals to be transmitted to each of cells evenly.

Yet another purpose of the present invention is to provide a semiconductor device having a high-power MOSFET that enhances voltage by a trench structure, increases the number of cells as many as possible and realizes heavy current.

Yet another purpose of the present invention is to provide a semiconductor device having a structure where a depletion layer of a pn junction in a cell region is extended to the outer peripheral part of a chip to enhance voltage thereof enhanced even though a gate pad is formed inside a recessed part.

A semiconductor device according to the present invention has a semiconductor layer; a recessed trench formed in the semiconductor layer so as to arrange transistor cells of a trench structure in a matrix form; a gate electrode disposed inside the recessed trench through a gate oxide film; a gate pad disposed continuously to the gate electrode; and a gate wiring comprised of a metal film, the gate wiring disposed being contacted with the gate pad, wherein the gate pad is disposed inside a recessed part formed in the same depth of the recessed trench.

By this structure, the gate pad is formed at a low position inside the recessed part (so-called a sink pad). Thus, the gate electrode formed inside the recessed trench and the gate pad contacted with the gate wiring are continuously formed with no steps, and even the gate pad formed over the semiconductor layer surface through a thin gate oxide film is formed with the gate oxide film in firm thickness with no corners, allowing sufficiently high gate voltage to be obtained. Consequently, a semiconductor device having sufficiently high gate voltage can be obtained even in an insulated gate MOSFET of the trench structure.

When each of the transistor cells of the trench structure is a transistor having a structure in which a channel diffusion region of a conductivity type different from that of the semiconductor layer and a source region of the same conductivity type as that of the semiconductor layer are sequentially disposed vertically on the surface side of the semiconductor layer around the gate electrode, the surface of the source region is directly disposed with a source wiring formed of a metal film, and an alloy layer where the metal of the source wiring is spiked into the source region and the channel diffusion region to obtain Ohmic contact is formed, the area of a source electrode contact part can be reduced significantly, the number of transistor cells per unit area can be increased to a great extent, and a power MOSFET of a trench structure with high gate voltage, small ON resistance, and heavy current can be obtained.

A p-type layer and an n-type layer in a ring shape are alternately disposed on an insulating film on the outer peripheral side beyond the cell region, whereby a bi-directional protection diode is formed. Metal films having contact with the innermost and outermost layers of the p-type layer or n-type layer in a ring shape are formed, respectively. Each of the metal films having contact in a ring shape is deposited continuously to any one of the source wirings and the gate wirings formed of a metal film. Accordingly, a MOSFET of a stable trench structure can be formed in which the protection diode can be inserted between the source and the drain with small series resistance and surges can be released through the protection diode even though they are applied.

The gate wiring is disposed as having contact with the outermost layer of the protection diode, a gate connecting part is formed so that the gate wiring is partially stepped over the protection diode to be connected to the gate pad around the cell region, and the gate connecting part and a source connecting part having contact with the innermost layer of the source wiring are alternately formed in plan. Accordingly, the gate wiring connected to the protection diode in the outer periphery of the chip allows signal transmission to the gate electrodes throughout the cells without forming the gate wiring around the cell region.

A diffusion region having a conductivity type different from that of the semiconductor layer is formed around the outermost periphery of the cell region, and the source wiring contacted with the innermost layer of the protection diode is also brought into contact with the diffusion region. Accordingly, a depletion layer is extended to the outer side of the diffusion region, and the cells in the outermost periphery can be protected, which are easy to break.

The gate pad disposed inside the cell region or around the outer periphery thereof is intermittently separated, the recessed part is not formed in the portion which the gate pad is not formed, a diffusion region comprised of a conductivity type different from that of the semiconductor layer is formed over the semiconductor layer surface, and the diffusion region allows the depletion layer formed between the channel diffusion region formed in each of the transistor cells and the semiconductor layer to be extended on the outer peripheral side of the semiconductor chip. Accordingly, even though the recessed part is formed for gate pad formation and a sallow diffusion region formed of the same conductivity type as that of the channel diffusion region is lost, a well region is formed to the end part side of the semiconductor chip through the gate electrode on the adjacent side of the channel diffusion region or source region in the transistor cells, for example, and thus the depletion layer formed between the channel diffusion region and the semiconductor layer can be extended to the end part side of the semiconductor chip, allowing voltage to be enhanced. On the other hand, the gate pad is formed in a portion where the gate electrode is extended straight. Therefore, it is formed inside the recessed part continuously to the gate electrode, and is connected to the gate wiring contacted thereon, with no interference in signal transmission to the gate electrodes.

A diffusion region formed of the same conductivity type as that of the channel diffusion region of the transistor cells is formed under the gate pad disposed inside the cell region or around the outer periphery thereof, deeper than the channel diffusion region of the transistor cells. Accordingly, even though the gate pad is formed inside the recessed part, a well region is formed under the recessed part, and the depletion layer can be extended to the end part side of the semiconductor chip.

BRIEF DESCRIPTION OF THE DRAWINGS

The teachings of the present invention can be readily understood by considering the following detailed description in conjunction with the accompanying drawings, in which:

FIGS. 2A to 2C depict sectional illustrations showing fabrication processes of the MOSFET represented in FIGS. 1A to 1C;

DETAILED DESCRIPTION OF THE INVENTION

Figure 1A:
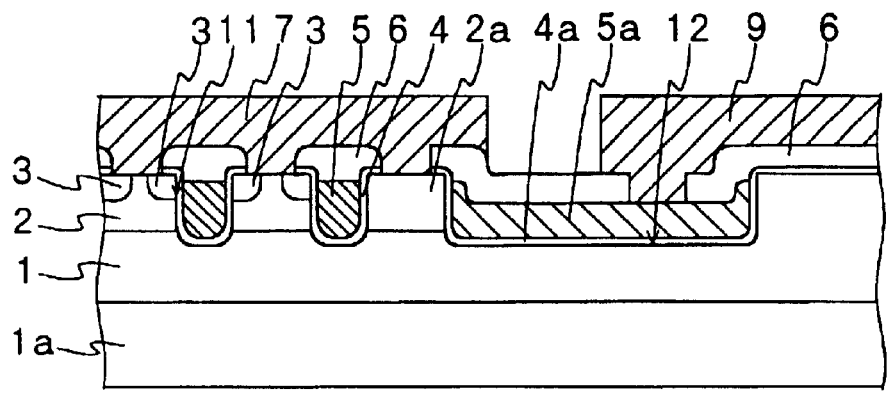
FIGS. 1A to 1C depict a section, a perspective view, and a plan view illustrating a vertical MOSFET of a trench structure as one embodiment of the semiconductor device according to the present invention.
Figure 1B:
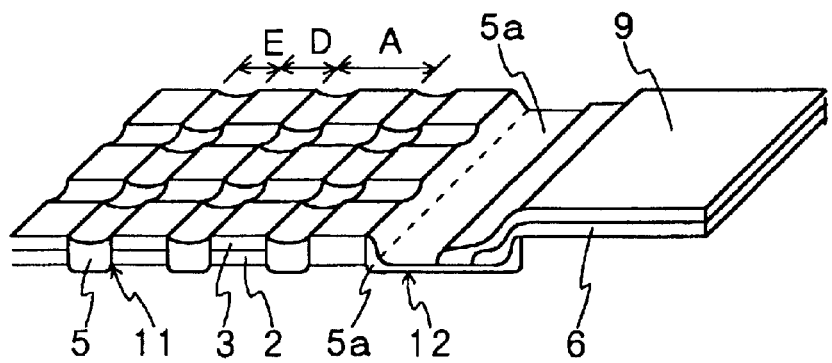
Figure 1C:
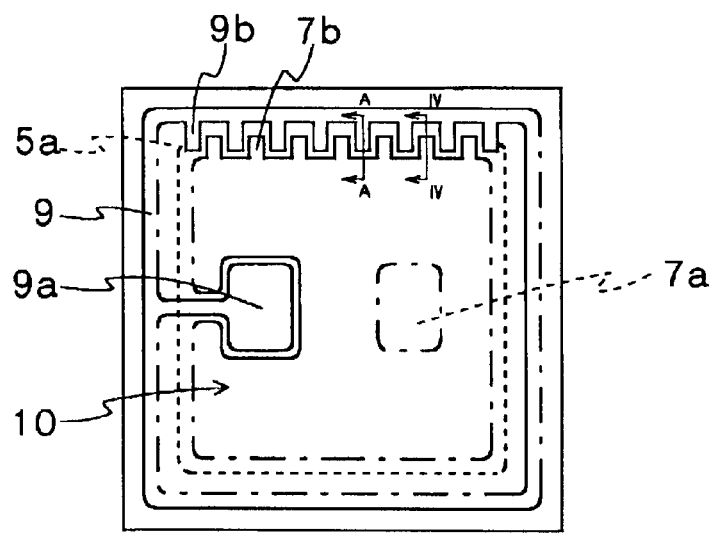

Next, the semiconductor device according to the present invention will be described with reference to the drawings. As shown in FIGS. 1A to 1C of the partially sectional illustrations depicting the MOSFET of one embodiment, the semiconductor device according to the invention has a cell region 10 where transistor cells of a trench structure are arranged in a matrix form, in which a recessed trench 11 is formed in a semiconductor layer 1, a gate oxide film 4 is formed inside the recessed trench 11, and a gate electrode 5 comprised of polysilicon is disposed inside the recessed trench 11. Then, a gate pad 5a is disposed continuously to the gate electrode 5 for having contact with a gate wiring 9 comprised of a metal film. The gate pad 5a is disposed inside a recessed part 12 formed simultaneously with the recessed trench 11, the recessed part is in the same depth as the recessed trench.

The semiconductor layer 1 is an n-type semiconductor layer comprised of silicon that is epitaxially grown to have a thickness of about 10 $\mu$m on an n$^+$-type semiconductor substrate 1a made of silicon, for example, having a high impurity concentration, in which the surface is diffused with p-type impurities comprised of boron and n-type impurities comprised of phosphorus are further diffused to form a p-type channel region 2 about one $\mu$m in thickness, and a mask is formed over the surface to diffuse n-type impurities to separately form an n$^+$-type source region 3 about 0.5 $\mu$m in thickness. The channel diffusion region 2 and the source region 3 can also be formed by diffusion after forming the recessed trench 11 and the gate electrode 5, described later.

Then, as shown in FIG. 1B of the perspective illustration before a source electrode is disposed, the recessed trench 11 is formed in a grid form with a width of about 0.35 to 1.0 $\mu$m (E) in a depth of about 1.5 $\mu$m, as a pitch A is at an interval of about 0.7 to 5 $\mu$m. The gate electrode 5 comprised of polysilicon is formed inside the recessed trench 11 through a gate oxide film 4.

The gate electrode 5 is formed only inside the recessed trench 11 in which polysilicon, for example, is deposited throughout the surface and then etched back to remove the polysilicon film other than the inside of the recessed trench 11. In the invention, the recessed part 12 is also formed in the portion to form the gate pad 5a for being connected to the gate wiring 9 comprised of Al simultaneously with the recessed trench 11 for forming the gate electrode 5, and the polysilicon film is also left to form the gate pad 5a inside the recessed part 12.

As shown in FIG. 1C of the plan view of the chip, for example, the gate pad 5a is formed as a gate finger around the cell region 10 (the surface of the cell region 10 is almost covered with the source wiring 7) and inside the cell region 10, if necessary, and is formed to have a width of about 20 $\mu$m so as to have contact with the gate wiring 9 formed continuously to a wire bonding part 9a, the gate wiring is comprised of Al. This is because the polysilicon film to be the gate electrode 5 alone has a greater resistant component, and transistor cells remote from the wire bonding part 9a cannot transmit signals sufficiently, therefore directly connecting the cells remote from the gate wiring comprised of a metal film.

In the example shown in FIGS. 1A to 1C, a structure is formed in which a protection diode, described later, is formed in a ring shape around the outer peripheral side beyond the gate pad 5a, the gate wiring 9 is formed in a ring shape around on the end part side of the chip so as to be connected to the outermost layer of the protection diode, and it is contacted with the gate pad 5a by a connecting part 9b where the gate wiring 9 is partially projected to the inner side. More specifically, the innermost layer of the protection diode is connected to the source wiring, and therefore it is formed so as to alternately engage a connecting part 7b of the source wiring. The engagement of the connecting parts 9b in the connecting parts 7b is formed throughout the periphery of the chip, but a part thereof is shown in FIG. 1C, omitting the rest with chain lines.

Figure 4:
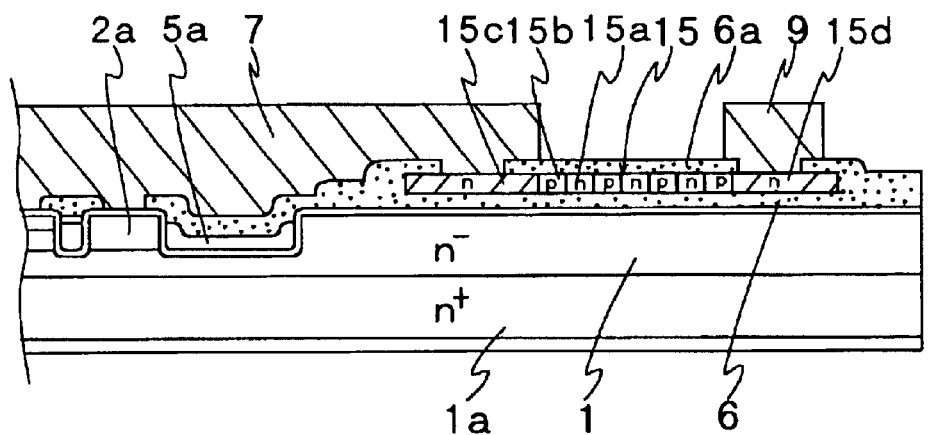
FIG. 4 depicts a sectional illustration showing a protection diode disposed around a chip peripheral part of the MOSFET represented in FIGS. 1A to 1C.

Traditionally, the gate pad 5a has been formed on the semiconductor layer surface through an oxide film 4a deposited simultaneously with the gate oxide film 4. However, as described above, a problem has arisen that the connecting part of the gate pad 5a to the gate electrode 5 inside the recessed trench 11 adjacent to the gate pad 5a is passed through the corner part of the recessed trench 11 and the thin gate electrode 4 becomes further thinner at the corner part, and thus the voltage is not sustained. However, in the invention, the gate pad 5a is formed inside the recessed part 12 made in the same depth as the recessed trench 11. Consequently, the connecting part of the gate electrode 5 to the gate pad 5a is passed through the inside of the recessed trench for connection with no need to be passed through the corner part of the gate trench 11, and thus gate voltage can be enhanced sufficiently. Additionally, a method for forming the gate pad 5a will be described later. In FIG. 1C, 7a denotes the wire bonding part of the source wiring. The section of a line A—A is shown in FIG. 1A, and the section of a line IV—IV is shown in FIG. 4.

The example shown in FIGS. 1A to 1C, on the surface formed with the gate electrode 5 and the gate pad 5a, an insulating film 6 such as $SiO_2$ is deposited by Chemical Vapor Deposition and is patterned to form a contact hole, and the surface is deposited with a metal film comprised of Al to be the source wiring 7 about 3 $\mu$m in thickness. The contact hole is formed in a separation part of the source region 2 described above so as to have Ohmic contact with both the channel diffusion region 2 and the source region 3 exposed in between.

Next, the method for fabricating the MOSFET will be described with reference to FIGS. 2A to 2C. First, as shown in FIG. 2A, the n-type semiconductor layer 1 is epitaxially grown on the n$^+$-type semiconductor substrate 1a about 10 $\mu$m in thickness. Then, an $SiO_2$ film, not shown, is deposited on the surface about 0.5 $\mu$m in thickness by CVD for patterning, whereby the place to form the gate electrode is exposed in a grid form, and the place to form the gate pad 5a is further exposed. Subsequently, the recessed trench 11 and the recessed part 12 of about 1.5 $\mu$m in depth are formed by dry etching such as Reactive Ion Etching (RIE). After that, annealing is performed under a water vapor atmosphere for about 30 minutes at temperatures of about 900 to 1000° C., whereby the gate oxide film 4 is deposited on the inner surface of the recessed trench 11 and the oxide film 4a is deposited on the surface of the recessed part 12 simultaneously.

Then, as shown in FIG. 2B, polysilicon is deposited over throughout the surface, and the polysilicon is buried inside the recessed trench 11 and the recessed part 12. To fully bury it inside the recessed trench 11, it is deposited to have a thickness about two times the depth of the recessed trench 11 to form the polysilicon film 13. Subsequently, a mask 14 comprised of resist is formed only on the surface inside the recessed part 12 to etch back the polysilison film 13 on the surface of the semiconductor layer 1 in about a half of the thickness by RIE. Then, the mask 14 is removed to further continue etch back, whereby the polysilicon film 13 on the surface of the semiconductor layer 1 is fully etched to expose the gate oxide film 4, terminating etching. Consequently, as shown in FIG. 2C, the polysilicon film is left only inside the recessed trench 11 and the recessed part 12, and the gate electrode 5 and the gate pad 5a are formed inside the recessed trench 11 and the recessed part 12. In this case, when an isotropic etchant is used, planarization in the shapes can further be intended.

After that, as shown in FIG. 2C, p-type impurities such as boron are diffused to form the p-type channel region 2, a mask not shown is formed, and n-type impurities such as phosphorus are diffused to form the $n^+$-type source region 3. Both diffusions are thus conducted in which the depth of the channel diffusion region 2 is about 0.5 to 1 $\mu$m in depth from the surface and the source region 3 is about 0.3 to 0.5 $\mu$m. Additionally, the outermost periphery of the cell region is not diffused with the n-type impurities, leaving the p-type diffusion region 2a alone. Then, the insulating film 6 comprised of $SiO_2$ is deposited throughout the surface by CVD, the contact holes are opened so as to expose the source region 3 and the gate pad 5a, and Al is deposited about three $\mu$m in thickness throughout the surface by sputtering, for example, for forming the source wiring 7. Subsequently, a metal such as Ti is deposited on the backside of the semiconductor substrate 1a about one $\mu$m in thickness by sputtering to form a drain electrode 8, whereby the MOSFET of the trench structure shown in FIG. 1A can be obtained.

Furthermore, in the example shown in FIGS. 2A to 2C, the recessed trench 11 and the recessed part 12 are formed, the gate oxide film 4 and the gate electrode 5 are formed, and then diffusions for the channel diffusion region 2 and the source region 3 are performed. However, it may be acceptable that after the semiconductor layer 1 is epitaxially grown, the channel diffusion region 2 and the source region 3 are formed throughout the surface, and the recessed trench 11 is formed for forming the gate electrode 5. Moreover, silicon is used as the semiconductor layer for the semiconductor substrate 1a and the semiconductor layer for growth. However, the use of SiC can further reduce series resistance and ON resistance, being suitable for the realization of heavy current.

Figure 3:
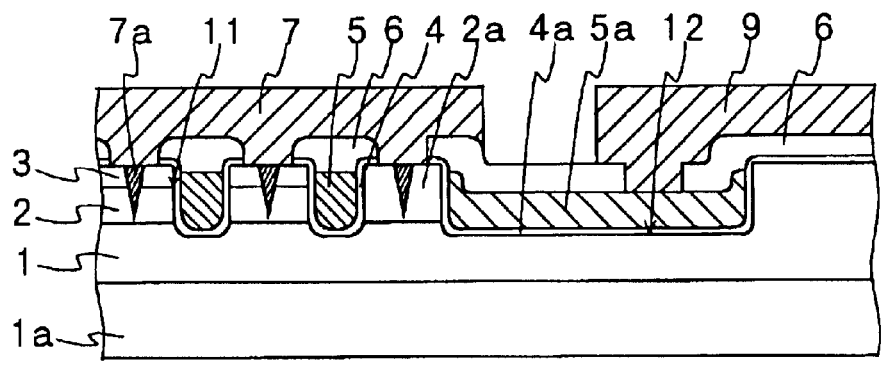
FIG. 3 depicts a sectional illustration showing another exemplary configuration of a cell part of the MOSFET represented in FIGS. 1A to 1C.

The example shown in FIGS. 1A to 1C and 2A to 2C, the source region 3 was separately formed on the front surface side of the channel diffusion region 2, and the source wiring 7 is formed so as to have Ohmic contact with both the channel diffusion region 2 and the source region 3. However, as shown in FIG. 3 of the sectional illustration as similar to FIG. 1A, for example, it may be possible that the source region 3 is not formed separately and is formed over throughout the surface of the channel region 2 to spike the metal of the source wiring 7 from the surface, whereby an alloy layer 7a is formed to have Ohmic contact with both the source region 3 and the channel region 2. When such the structure is formed, it is preferable that a cell pitch is made smaller and the number of cells can be increased to allow the realization of heavy current.

The alloy layer 7a is formed into a pointed shape as shown in FIG. 3 in which the metal film such as Al to be the source wiring 7 described above is formed and annealed under an $N_2$ atmosphere for about 30 minutes at a temperature of about 400° C., whereby Si in the interface between the source wiring 7 and the source region 3 is diffused to Al and alloying of Al and Si proceeds into the inside of the semiconductor layer for spiking. The alloy layer 7a is varied in the depth spiked into the inside according to the temperatures and periods of time of annealing, and thus it is necessary to control annealing conditions so that the alloy layer 7a enters the inside of the channel diffusion region 2 while not reach the semiconductor layer 1 to penetrate through the channel diffusion region 2.

More specifically, the inventors conducted dedicated investigations in order to obtain a semiconductor device capable of reducing the ON resistance of an insulated gate semiconductor device and attaining a large current with a small chip size. Consequently, we found that an amount of the metal film disposed over the semiconductor layer surface entering the semiconductor layer by spiking can be controlled by regulating a thickness of the metal film to be deposited and conditions in annealing, the control allows Ohmic contact only with the source region 3 and the channel region 2 without penetrating through the channel region 2, as shown in FIG. 3, and the cell size can be reduced to the utmost limit.

The depth of the alloy layer, that is, the depth of spikes became deeper by increasing temperatures in annealing and prolonging a period of time in annealing, allowing highly accurate control. For example, when an Al film is disposed over Si, alloying is started at a temperature of about 300° C., but it is most efficient to perform at a temperature of about 400° C., allowing highly accurate control over the depth of spikes. For instance, annealing is performed at a temperature of about 400° C. for about 30 minutes, whereby spiking is allowed only about 0.6 to 0.8 $\mu$m in depth. When the diffusion depths are about 0.5 $\mu$m in the source region 3 and about 1 $\mu$m in the channel region 2 as described above, the alloying process is performed under this condition, whereby Ohmic contact is allowed with both layers and no risks to penetrate through the channel region 2 are generated. Consequently, when the portion vertically overlapping the channel region 2 with the source region 3 is formed as described above and the metal such as Al is spiked from the surface, Ohmic contact was allowed directly with both layers.

As shown in FIGS. 1A to 1C and FIG. 3, the invention is characterized in that the gate pad 5a is formed inside the recessed part 12. More specifically, the gate electrode 5 continues to the gate pad 5a inside the recessed trench 11 and the recessed part 12. Thus, a step rising from the recessed trench 11 to the semiconductor layer surface is not formed in the midway, not passing through the corner part in the upper surface of the recessed trench for formation. Consequently, the oxide film is not passed through the corner part of the recessed trench, where it is difficult to form the oxide film, even though the gate pad 5a is formed through a thin oxide film such as a gate oxide film. Therefore, the oxide film is surely formed, and gate voltage can be obtained sufficiently.

In the example shown in FIGS. 1A to 1C and FIG. 3, only the portion of the cell region 10 and the gate pad 5a are depicted, but the protection diode such as a bi-directional Zener diode is preferably inserted between the gate and the source for protection against surges. The portion of the protection diode is depicted in FIG. 4.

A protection diode 15 is not disposed over the cell region 10 (see FIG. 1C), but is formed on the outer peripheral side of the cell region 10 (the region formed with the source wiring 9). In the example shown in FIG. 4, a field part is disposed around throughout the outer peripheral part of the semiconductor chip so as to terminate the depletion layer of each of the transistor cell parts in a portion remote from the cell region as far as possible, being formed of a polysilicon film, for example, in a ring shape on the insulating film (filed oxide film) 6 comprised of $SiO_2$ in the field part. FIG. 4 is equivalent to the IV—IV section shown in FIG. 1C. In the example shown in FIG. 4, the polysilicon film is formed in which the gate electrode 5 or gate pad 5a is formed to deposit the insulating film 6 and then the polysilicon film is again deposited. However, it may be deposited simultaneously with the formation of the gate electrode 5 or gate pad 5a. The polysilicon film is patterned, impurities are introduced to arrange an n-type layer 15a and a p-type layer 15b alternately, and a plurality of pn junction parts are laterally formed in series.

The polysilicon film described above is configured such that it is deposited about 0.5 $\mu$m in thickness and the n-type layer 15a and the p-type layer 15b are alternately formed in a ring shape with a width of about 4 $\mu$m, for example. The concentrations of impurities in the n-type layer 15a and the p-type layer 15b are about $5\times10^{20}$ $cm^3$ and $7\times10^{17}$ $cm^3$, respectively. It is set to obtain a required breakdown voltage by the impurity concentrations and the number of the pn junctions. A method for forming the protection diode 15 with the n-type layer 15a and the p-type layer 15b is that for example, the polysilicon film is doped with a p-type dopant throughout the surface and then patterned, an n-type dopant is doped in a ring shape so as to have the impurity concentrations as described above for alternately repeating the n-type layer 15a and the p-type layer 15b in plan, and the bi-directional Zener diode is formed.

The breakdown voltage of the protection diode 15 can be adjusted to some extent by regulating the impurity concentrations as described above. The impurity concentrations are set to be about 5 to 10 V in a single diode in general. Then, such the protection diode 15 is formed that about 3 to 4 pn junction parts, for example, are formed to be broken down at 20 to 30V.

Figure 5:
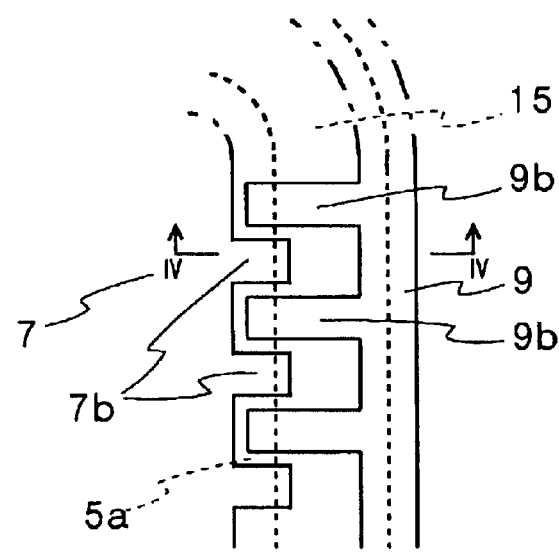
FIG. 5 depicts a plan illustration showing a connecting part of the protection diode to a source wiring and a gate wiring represented in FIG. 4.

In the example shown in FIG. 4, an n-type layer 15d of the outermost periphery of the protection diode 15 is contacted with the gate wiring 9, and a layer 15c of the innermost is contacted with the source wiring 7. On this account, as also briefly described in FIGS. 1A to 1C, the gate wiring 9 is placed on the outer peripheral side beyond the gate pad 5a. To contact the gate wiring 9 with the gate pad 5a, as shown in FIG. 5 of a partial plan illustration depicting the connection structure of the protection diode 15 to the gate wiring 9 and the gate pad 5a, the connecting part 7b to the protection diode 15 of the source wiring 7 and the connecting part 9b to the gate pad 5a of the gate wiring 9 are alternately engaged and formed extending to the protection diode 15 side, being formed as comb teeth are engaged. Consequently, the gate wiring 9 is contacted with the gate pad as well as it has contact with the outermost layer of the protection diode 15. Additionally, in FIG. 5, the section of a line IV—IV is the section shown in FIG. 4.

In this manner, both end parts of the protection diode 15 are directly contacted with the gate wiring and the source wiring comprised of metals, whereby it is allowed to be incorporated as reducing series resistance significantly. Thus, surges can be released immediately even when they enter, and it can serve as the protection diode sufficiently. More specifically, when the protection diode is connected through a high concentration region in the semiconductor layer, even the high concentration region has resistance components. Therefore, it takes time to carry current due to surges, and transistor cells often broken during it. However, it is directly connected to the wirings comprised of metal films, whereby the protection diode is inserted with a low resistance. Thus, surges can be released immediately.

As shown in FIGS. 1A to 1C and FIG. 4 and as described above, the transistor cells are not formed (n-type impurities are not diffused) on the outermost peripheral side of the cell region 10 (on the gate pad 5a side that is disposed around the outer peripheral part of the chip in a ring shape), only the p-type diffusion region 2a similar to the body region is formed, and the source wiring 7 is also contacted with the diffusion region 2a, whereby the curvature of the depletion layer can be taken, and electric field concentration can be avoided. Thus, voltage can further be enhanced. More specifically, the depletion layer formed between the channel diffusion region of the transistor cells and the semiconductor layer is extended beyond the p-type well to the outer side and is allowed to extend to the end part side of the semiconductor chip, and thus voltage can be made greater.

Figure 6A:
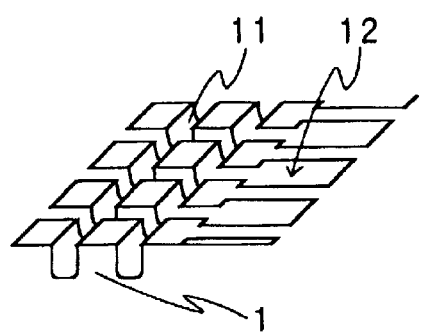
FIGS. 6A to 6C depict sectional illustrations showing another embodiment of a gate pad structure according to the present invention.
Figure 6B:
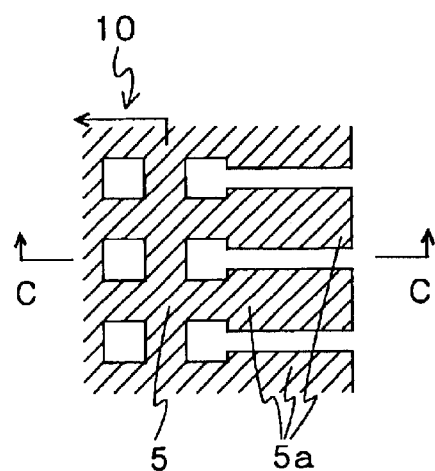
Figure 6C:
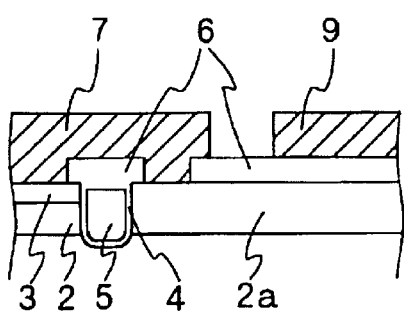

FIGS. 6A to 6C depict an exemplary structure for preventing the depletion layer from not spreading from the cell region because the gate pad 5a is formed inside the recessed part 12, as described above. More specifically, the p-type channel diffusion region 2 or p-type diffusion region 2a is formed shallower than the recessed trench 11 or recessed part 12. Therefore, when the recessed part 12 is disposed continuously to the outer periphery of the cell region (continuously to the corresponding part of gate fins when they exist), the depletion layer is finished in the recessed part 12 and is not allowed to extend to the end of the chip outer periphery, dropping voltage. Then, as shown in FIG. 6A of the perspective view, FIG. 6B of the plan illustration depicting the portion of the gate electrode 5 and the gate pad 5a by slashes, and FIG. 6C of the section of a line C—C shown in FIG. 6B, the gate pad 5a is not formed continuously to the outer periphery of the cell region 10, the gate pad 5a is formed in the connecting part to the gate electrode 5, the recessed part is not formed in the adjacent part of the p-type diffusion region (well) 2a, and the p-type diffusion region (well) 2a is formed so as to extend to the end part side of the chip directly.

Because of being thus formed, even though the gate pad 5a is formed inside the recessed part 12 and the p-type diffusion region 2a is shallow, the depletion layer of the pn junction is also extended continuously from the cell region 10 to the portion of the gate pad 5a, the depletion layer is allowed to extend to the field portion on the end part side of the chip, and voltage can be enhanced sufficiently. Furthermore, even though the gate pad is separated in this manner, the gate wiring 9 is contacted thereon, and the gate wiring 9 is formed continuously to the periphery of the chip, thus generating no problems.

Figure 7:
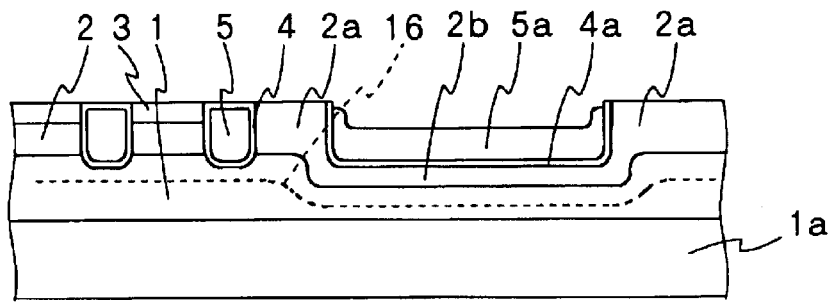
FIG. 7 depicts a sectional illustration of an example in which a gate pad is formed inside a recessed part and a depletion layer in a cell region is extended to a chip end part.
Figure 8A:
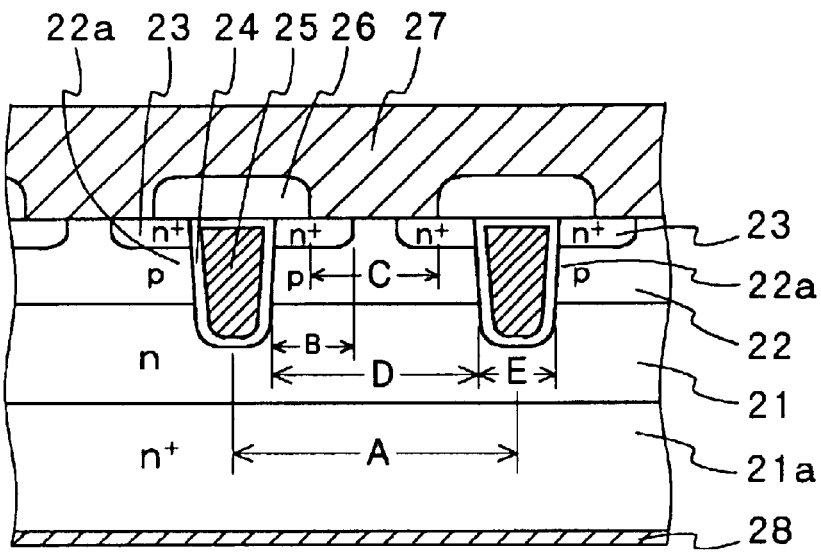
FIGS. 8A to 8C depict illustrations showing a MOSFET structure according to the traditional trench structure.
Figure 8B:
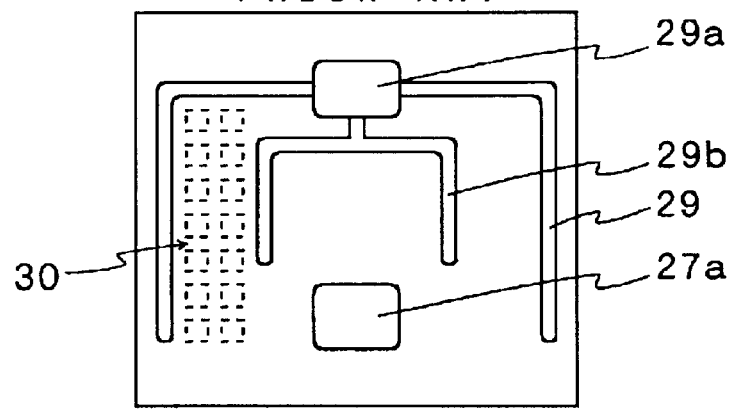
Figure 8C:
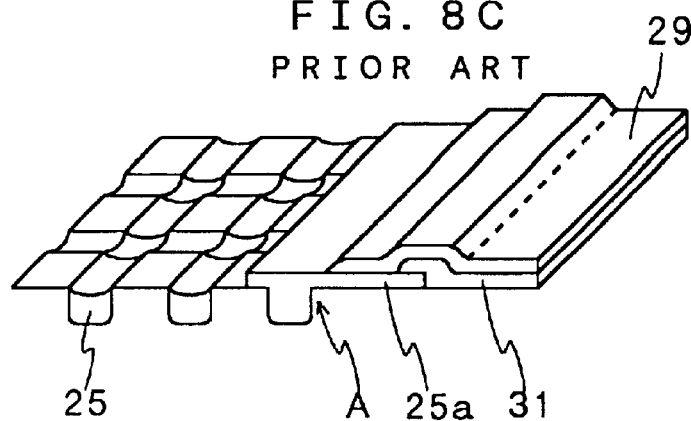

FIG. 7 is a view illustrating another exemplary structure for preventing the depletion layer from not spreading from the cell region due to the formation of the gate pad 5a inside the recessed part 12. More specifically, in this example, the gate pad 5a is formed continuously to the outer peripheral part of the cell region 10 (continuously to the corresponding region of gate fins inside the cell region when they exist), and only the portion of the recessed part 12 to form the gate pad 5a further undergoes p-type diffusion to deeply form the diffusion region (p-type well). To form this deep diffusion region 2b, after the recessed trench described above and the recessed part 12 to form the gate pad are formed by etching, the portion other than the recessed part 12 is covered with a mask such as resist, and p-type impurities are introduced and diffused by ion injection, whereby the deep p-type diffusion region 2b can be formed only under the recessed part 12. Additionally, in FIG. 7, the portions the same as the portions shown in FIGS. 1A to 1C are designated the same numerals and signs, omitting the description thereof.

Because of being formed in this manner, the depletion layer 16 of the pn junction can be extended to the field portion of the chip end part from the cell region, passing under the gate pad part. Furthermore, when such the structure is formed, the gate pad around the cell region can be formed continuously with no interruption, and thus the protection diode described above can also be formed on the gate pad.

Each of the examples described above was the examples of the vertical MOSFET. However, it can be adapted to all the power devices of the trench structure such as an insulated gate bipolar transistor (IGBT) further incorporating a bipolar transistor in the vertical MOSFET.

According to the present invention, in the MOSFET of the trench structure, the gate pad is also formed inside the recessed part similar to the trench of the gate electrode. Thus, the connecting part of the gate electrode to the gate pad continues inside the recessed trench and the recessed part, and a step rising from the recessed trench to the semiconductor substrate surface is not formed. On this account, the connecting part of the gate electrode to the gate pad is not passed over the gate oxide film in the corner part of the recessed trench, and gate voltage can be enhanced significantly. Accordingly, the weaknesses of gate voltage critical to the MOSFET of the trench structure can be overcome.

What is claimed is:

1. A semiconductor device comprising:

a semiconductor layer;

at least one recessed trench formed in the semiconductor layer so as to define transistor cells of a trench structure;

a gate oxide film extending along a bottom and side walls of the recessed trench;

a gate electrode disposed inside the recessed trench;

a gate pad disposed continuously to the gate electrode; and a gate wiring comprised of a metal film, the gate wiring being in contact with the gate pad, wherein the gate pad is disposed inside a recessed part formed in a same depth as the recessed trench and the gate wiring is in contact with the gate pad inside the recessed part.

2. The semiconductor device according to claim 1, wherein each of the transistor cells of the trench structure has a structure, in which a channel diffusion region having a conductivity type different from that of the semiconductor layer and a source region having a same conductivity type as that of the semiconductor layer are sequentially disposed vertically on a side of a surface of the semiconductor layer; a source wiring comprised of a metal film is directly disposed over a surface of the source region; and the metal of the source wiring is spiked into the source region and the channel diffusion region, whereby an alloy layer is formed and Ohmic contact can be obtained.

3. The semiconductor device according to claim 1, wherein a bi-directional protection diode is formed by alternately disposing a p-type layer and an n-type layer in a ring shape in plan over an insulating film on an outer peripheral side beyond the cell region, and metal films having contact in a ring shape with an inner most layer and an outermost layer of the p-type layer or n-type layer are disposed, respectively, in which each of the metal films having contact in the ring shape is formed continuously to any one of the source wiring and the gate wiring comprised of a metal film.

4. The semiconductor device according to claim 3, wherein the gate wiring is disposed having contact with an outermost layer of the protection diode, a gate connecting part is formed so that the gate wiring is partially stepped over the protection diode and connected to the gate pad around the cell region, and the gate connecting part and a source connecting part having contact with the innermost layer of the source wiring are alternately formed in plan.

5. The semiconductor device according to claim 3, wherein a diffusion region having a conductivity type different from that of the semiconductor layer is formed in an outermost periphery of the cell region, and the source wiring contacted with an innermost layer of the protection diode is also contacted with the diffusion region.

6. The semiconductor device according to claim 1, wherein a gate pad disposed inside or around an outer periphery of the cell region is intermittently separated, the recessed part is not formed in a portion not disposed with the gate pad, a diffusion region comprised of a conductivity type different from that of the semiconductor layer is formed over a surface of the semiconductor layer, and the diffusion region allows a depletion layer formed between the channel diffusion region formed in each of the transistor cells and the semiconductor layer to extend to an outer peripheral side of a semiconductor chip.

7. The semiconductor device according to claim 1, wherein a diffusion region comprised of a same conductivity type as that of a channel diffusion region of the transistor cells is formed under a gate pad disposed inside or around an outer periphery of the cell region, deeper than the channel diffusion region.

8. The semiconductor device according to claim 1, wherein said gate wiring is in contact with said gate pad through an insulating film having a contact hole, said insulating film covering a corner part between the recessed part and a surface of the semiconductor layer.

* * * * *